United States Patent [19]

Hsieh et al.

[11] Patent Number: 4,941,893
[45] Date of Patent: Jul. 17, 1990

[54] GAS SEPARATION BY SEMI-PERMEABLE MEMBRANES

[75] Inventors: Shan-Tao Hsieh, Charleston; George E. Keller, II, South Charleston, both of W. Va.

[73] Assignee: Union Carbide Chemicals and Plastics Company, Inc., Danbury, Conn.

[21] Appl. No.: 409,059

[22] Filed: Sep. 19, 1989

[51] Int. Cl.$^5$ .................. B01D 53/22; B01D 71/68
[52] U.S. Cl. ....................... 55/16; 55/71; 55/72; 423/342; 423/347
[58] Field of Search ............... 55/16, 71, 72, 158; 423/248, 342, 347

[56] References Cited

U.S. PATENT DOCUMENTS

| | | | |
|---|---|---|---|
| 4,214,020 | 7/1980 | Ward et al. | 55/158 X |
| 4,230,463 | 10/1980 | Henis et al. | 55/71 X |
| 4,243,701 | 1/1981 | Riley et al. | 55/158 X |
| 4,313,013 | 1/1982 | Harris | 55/16 X |
| 4,398,926 | 8/1983 | Doshi | 55/158 X |
| 4,484,935 | 11/1984 | Zampini | 55/158 |
| 4,515,762 | 5/1985 | Griesshammer et al. | 55/71 X |
| 4,519,999 | 5/1985 | Coleman et al. | 55/71 X |
| 4,654,047 | 3/1987 | Hopkins et al. | 423/248 X |
| 4,676,967 | 6/1987 | Breneman | 423/342 X |
| 4,772,296 | 9/1988 | Potts | 55/72 X |
| 4,826,599 | 5/1989 | Bikson et al. | 55/16 X |
| 4,875,945 | 10/1989 | Penzhorn et al. | 423/248 X |

FOREIGN PATENT DOCUMENTS

| | | | |
|---|---|---|---|
| 0075431 | 3/1983 | European Pat. Off. | 55/16 |
| 0301597 | 2/1989 | European Pat. Off. | 55/16 |
| 1181202 | 2/1970 | United Kingdom | 55/71 |

OTHER PUBLICATIONS

D. L. MacLean et al., "Hollow Fibers Recover Hydrogen", Chemical Engineering, Feb. 25, 1980, vol. 87, No. 4, pp. 54 and 55.

Primary Examiner—Robert Spitzer

[57] ABSTRACT

A method is disclosed for separating gaseous silicon compounds from hydrogen and/or hydracids. Specifically, the method comprises the utilization of semipermeable membranes for such gaseous separation. Particularly preferred is a composite membrane comprised of a coating separation layer of sulfonated polysulfone and a support layer of polysulfone. Mixtures of hydrogen and silane are particularly suitable for being separated by means of composite membrane separation.

74 Claims, 5 Drawing Sheets

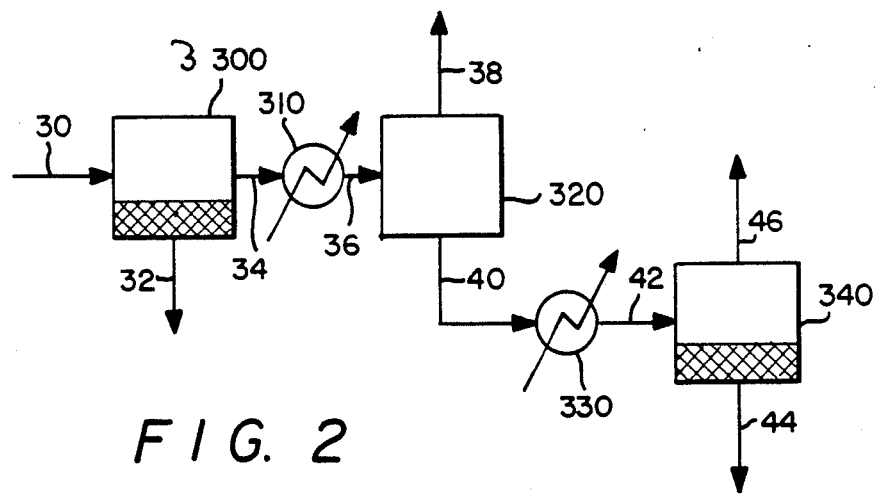
F I G. 2
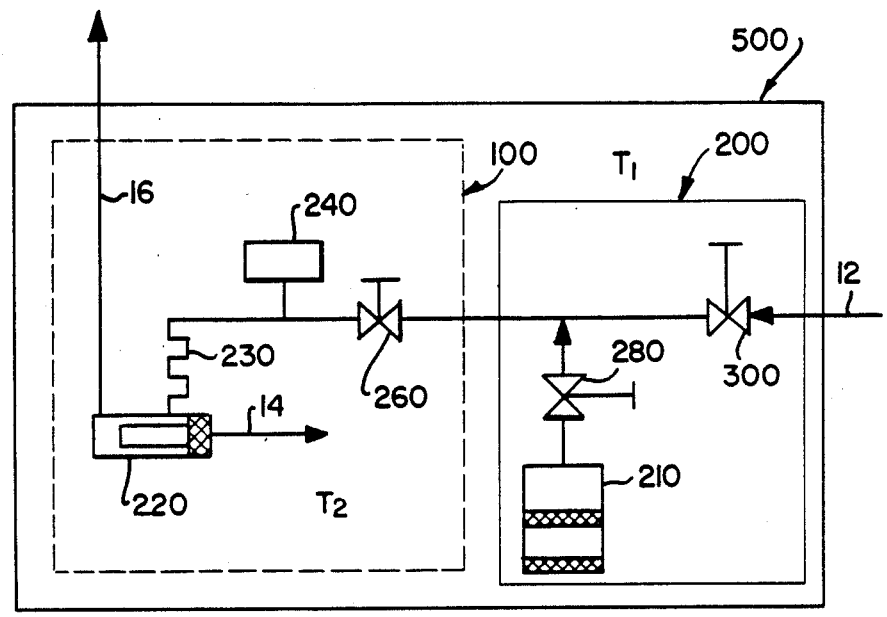
F I G. 3

4,941,893

GAS SEPARATION BY SEMI-PERMEABLE MEMBRANES

BACKGROUND OF THE INVENTION

1. Field Of The Invention

This invention pertains to the field of gas separation and, more particularly, gas separation by the use of semi-permeable membranes. More specifically, the present invention relates to the separation of gaseous components which are frequently present in various gas stream mixtures found in the production and/or reaction of polycrystalline and/or epitaxial silicon metals.

2. Discussion Of Related Art

Polycrystalline and epitaxial silicon metals employed in semi conductor usage are typically produced by the reduction and decomposition of silicon tetrachloride, trichlorosilane, dichlorosilane and/or silane. These silicon containing gaseous compounds are typically mixed with large concentrations of hydrogen gas and reacted at activation temperatures sufficient to effect reduction and decomposition whereby to deposit silicon metal by such reaction on predetermined substrates.

Thus, for example, in the production of polycrystalline silicon by a process commonly referred to as the Siemens-type process, trichlorosilane is reacted with hydrogen to form polycrystalline silicon on a heated elongated starter rod positioned within a bell jar reactor, as described in U.S. Pat. No. 3,979,490. In an alternative process, as described in U.S. Pat. No. 4,150,168, silane is thermally pyrolyzed in such a bell-jar type reactor in the presence of hydrogen to form the polycrystalline silicon on the elongated starter rod.

Instead of a bell jar type reactor, a fluidized bed has also been utilized to form polycrystalline silicon on seed particles as discussed in U.S. Pat. Nos. 3,012,861 and 3,012,862.

Silane, which may be used as a precursor material for the formation of the polycrystalline silicon, may be prepared by disproportionation as disclosed in U.S. Pat. No. 3,968,199 or by reduction of metallurgical silicon as discussed in U.S. Pat. No. 4,676,967.

So too, in the preparation of silicone compounds, silicon metal is generally hydrochlorinated to an intermediary product stream comprising trichlorosilane and hydrogen from which intermediary stream the final silicone compounds are ultimately prepared.

In essentially all of these techniques, there are gaseous streams produced which contain gas mixtures of one or more gaseous silicon compounds, such as halogenated halosilanes, and the like, which are in admixture with hydrogen and hydracids such as hydrogen chloride, and the like. Such gas mixtures may be present in intermediary process streams, waste streams, by-product streams, or even product streams as well.

Frequently, it is desirable to be able to separate these gaseous silicon components from the hydrogen or gaseous hydracids for purposes of purification and/or recovery of these various components. Processes which are currently available for such separation are generally either economically undesirable or are not very effective in achieving the desired separation. Indeed, in a number of instances, such as in the thermal pyrolysis of silane to form polycrystalline silicon, the exhaust gas consisting of silane and hydrogen is simply flared rather than attempting to separate the silane from the hydrogen.

A need accordingly exists for providing a technique in which the components of such gaseous mixtures may economically and efficiently be separated.

SUMMARY OF THE INVENTION

By virtue of the present invention, a new technique has been discovered which is capable of effectively separating gaseous silicon compounds from hydrogen or hydracids in an economical and efficient manner.

More particularly, these gaseous components may be separated by contacting such a gaseous stream with a suitable semi-permeable membrane to effect such separation. Such a semi-permeable membrane may include an asymmetric membrane having a thin separation layer which determines the overall gas separation characteristics of the membrane. Alternatively, the semi-permeable membrane may also include a composite membrane comprised of a porous support layer having substantially no separation characteristics with respect to the gaseous components and a substantially non-porous separation layer positioned on the support layer which substantially determines the selective permeation characteristics of the overall composite membrane.

Thus, the present invention is directed to a method for separating at least a first gas selected from the group consisting of H$_2$, HX and mixtures thereof contained in a gaseous mixture from at least a second gas selected from the group consisting of SiX$_a$H$_b$ and mixtures thereof; where X = a halogen ion,
a = 0 to 4,
b = 0 to 4, and
a + b = 4 contained in said gaseous mixture which comprises contacting the gaseous mixture with one surface of a semi-permeable membrane which exhibits selective permeation of the at least first gas over that of the at least second gas, and removing from the vicinity of the opposite surface of the membrane a permeate having a concentration of the at least first gas which is greater than the concentration of the at least first gas in the gaseous mixture.

In preferred embodiments of the present invention, composite membranes are utilized to carry out the specified separation.

A particularly preferred composite membrane which provides excellent separation and permeation as well as excellent chemical stability and resistance to the gaseous silicon components and the hydracids is a separation layer comprised of sulfonated-polysulfone and a support layer comprised of polysulfone.

BRIEF DESCRIPTION OF THE DRAWINGS

FIG. 2 is a schematic diagram of a process in which an intermediary stream containing a mixture of at least trichlorosilane and hydrogen from a silicone production process is treated so as to recover trichlorosilane utilizing a membrane separator in accordance with the present invention.

FIG. 3 is a schematic diagram of an apparatus used for measuring the permeability of a gas through a semi-permeable membrane.

DETAILED DESCRIPTION OF THE INVENTION

Figure 1:
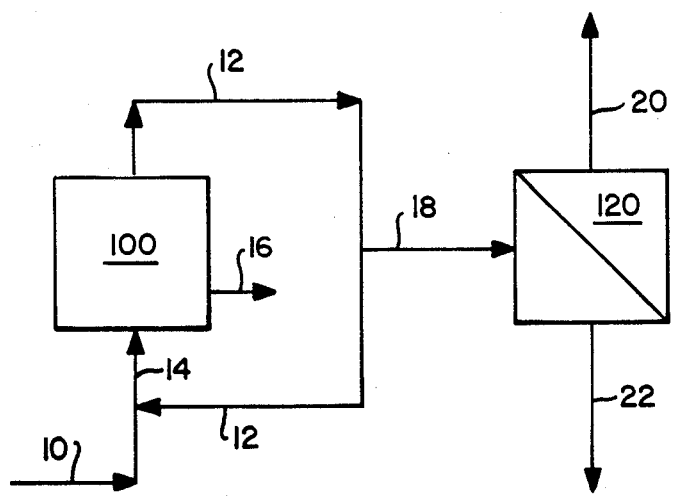
FIG. 1 is a schematic diagram of a polysilicon production process utilizing a membrane separator in accordance with the present invention to separate silane from hydrogen.

While the present invention is primarily directed to the field of polycrystalline and epitaxial silicon production and/or silicon reactions, it is understood that the invention is not limited exclusively to this technological field. Rather, the invention is directed to the separation of the type of gaseous components which are typically found in such silicon production/reaction techniques but which may be present in any other processing environment.

Typically, the gaseous silicon compounds, in addition to silane ($SiH_4$), are generally chlorinated silanes such as silicon tetrachloride ($SiCl_4$); trichlorosilane ($SiCl_3H$); dichlorosilane ($SiCl_2H_2$); and monochlorosilane ($SiClH_3$). Inasmuch as hydrogen is primarily utilized for reduction and/or disproportionation purposes, in addition to such hydrogen being present in the gas streams, hydrogen chloride (HCl) may be present as well.

By virtue of the present invention, it has been discovered that semi-permeable membranes, particularly composite membranes, can effectively be utilized to separate these gaseous silicon compounds from the hydrogen or hydrogen chloride. As is well known to those skilled in the art of membrane technology, when referring to a number of gaseous components contained in a gas mixture, there may be a number of such components which will readily permeate through a semi permeable membrane at a rate which is much greater than other components contained in such gas mixture. Those components which do, in fact, permeate at a relatively faster rate are typically referred to as "fast" gases for that particular gaseous mixture as compared to the "slow" gases which permeate at a lesser rate or not at all. With respect to a mixture of gaseous silicon compounds and hydrogen or hydrogen chloride, we have learned that the silicon compounds are "slow" gases as compared to the hydrogen and hydrogen chloride which are "fast" gases. As a result of appreciating that there is such a difference in permeation rates between the gaseous silicon compounds and the hydrogen or hydrogen chloride, we have realized that semi-permeable membrane separation was possible. However, and most importantly, we have also discovered that there are membranes, particularly composite membranes, which not only have excellent separation and permeability characteristics but which are, additionally, chemically resistant to these gaseous silicon compounds which typically have a corrosive nature.

Althouqh the process for the production of pure polycrystalline silicon primarily utilizes silane or chlorinated silane precursor materials, the present invention is not limited to only the separation of the chlorinated form of these compounds. Indeed, gaseous silicon compounds containing other halogen ions, namely, bromides, iodides, and fluorides, may be separated from hydrogen and/or HCl, HBr, HI or HF. Accordingly, the present invention is capable of effectively separating one or more slow gaseous components selected from the group consisting of $SiX_aH_b$ from one or more fast gaseous components selected from the group consisting of $H_2$ or HX, wherein $X$ = Cl, Br, I and Fl, $a$ = 0 to 4, $b$ = 0 to 4, and where $a + b$ = 4.

To achieve selective separation, the semi-permeable membrane must exhibit less resistance to the permeation of one or more components than that of at least one other component contained within the gaseous mixture. Thus, selective separation can provide preferential depletion or concentration of one or more desired components in the mixture with respect to at least one other component and therefore provides a product having a different proportion of the one or more desired components to the at least one other component than that proportion in the mixture.

However, in order for membrane separation of one or more desired components to be commercially attractive, the membranes must not only be capable of withstanding the conditions to which they may be subjected during the separation operation, but also must provide an adequately selective separation of the one or more desired components, i.e., a high separation factor, as well as a sufficiently high flux, i.e., a high permeation rate, so that the use of such a separation procedure is carried out on an economically attractive basis.

With respect to reactive, gaseous silane-containing streams, alteration of the chemcial structure of the membrane may occur, particularly if a polymer-based membrane is utilized. Such alteration may sometimes be acceptable if it does not lead to deterioration of long term membrane performance. By virtue of the present invention, as a preferred embodiment, it has been determined that composite membranes, particularly sulfonated polysulfone on polysulfone composite membranes, are capable of providing desirably high separation factors and high permeation rates with respect to the gaseous components discussed above, including excellent chemical stability.

Asymmetric type membranes are comprised essentially of a single permeable membrane material distinguished by the existence of two distinct morphological regions within the membrane structure. One region comprises a thin, dense semi permeable skin capable of selectively permeating one component of a fluid mixture. The other region comprises a less dense, porous, non selective support region that serves to preclude the collapse of the thin skin region of the membrane under pressure.

Composite membranes generally comprise a thin layer or coating of a suitable essentially non-porous membrane material superimposed on a porous substrate. This coating layer, also referred to herein as a separation layer, determines the separation characteristics of the composite structure, and is advantageously very thin so as to provide the desirably high permeablity referred to above. The substrate or support layer only serves to provide a support for the membrane layer positioned thereon and has substantially no separation characteristics with respect to the gaseous mixture being separated or concentrated.

These membranes may be fabricated in various shapes, such as (1) a flat sheet which may be supported in a typical plate and frame structure similar to a filter press; (2) a flat sheet rolled into spirals with spacing materials interleaved with the membrane and the assembly sealed to provide spiroidal channels permitting the passage of the feed on one side of the coiled membrane to the opposite side of the membrane; (3) as tubes lining the inner surface of a reinforced braid, the braid itself at times being a component in a larger tube; or (4) in the form of open-ended hollow fibers so organized and sealed into header plates so as to provide a separation of the flow over the external surfaces of the hollow fibers from any flow within the bores of the hollow fibers ensuing by virtue of passage of the gaseous feed mixture across the membrane. Such hollow fiber construction is preferred in the process of the present invention.

The invention is further described herein, for convenience of description, with particular reference to hollow fiber composite membranes. It will be understood, however, that the scope of the present invention is not limited to the use of the membranes in the composite structure in the hollow fiber form.

The hollow fiber membranes typically used in the art have continuous channels for fluid flow extending between the exterior and interior surfaces. Frequently, the pores have an average cross-sectional diameter less than about 20,000 Angstroms and in some hollow fibers the cross-sectional diameter is less than about 1,000 or 5,000 Angstroms. Advantageously, the walls of the hollow fibers are sufficiently thick that no special apparatus is required for their handling. Frequently, the hollow fibers may have outside diameters of about 20 to 1,000 microns, generally about 50 to 1,000 microns, and have walls of at least about 5 microns in thickness, generally about 50 to about 1,000 microns thick. The wall thickness in some hollow fibers may be up to about 200 or 300 microns. The coating may have a thickness ranging from about 0.01 to about 10 microns and preferably has a thickness of about 0.05 to about 2 microns.

In order to provide desirable fluxes through the hollow fibers, particularly using those hollow fibers having walls at least about 50 microns in thickness, the hollow fibers may have a substantial void volume. Voids are regions within the walls of the hollow fibers which are vacant of the material of the hollow fibers. Thus, when voids are present, the density of the hollow fiber is less than the density of the bulk material of the hollow fiber. Often, when voids are desired, the void volume of the hollow fibers is up to about 90, generally about 10 to 80, and sometimes about 20 or 30 to 70, percent based on the superficial volume, i.e., the volume contained within the gross dimensions, of the hollow fiber. The density of the hollow fiber can be essentially the same throughout its thickness, i.e., isotropic, or the hollow fiber can be characterized by having at least one relatively dense region within its thickness in barrier relationship to fluid flow through the wall of the hollow fiber, i.e., the hollow fiber is anisotropic. Generally, a relatively dense region of anisotropic hollow fibers is essentially at the exterior or interior of the hollow fiber, and preferably, the coating contacts this relatively dense region.

The material used for the hollow fiber may be a solid, natural or synthetic substance. The selection of the material for the hollow fiber may be based on the heat resistance and/or mechanical strength of the hollow fiber, as well as other factors dictated by the separation process of the present invention and the operating conditions to which it will be subjected. Most importantly, the materials used, whether it be the porous support layer or the essentially non porous coating layer must be chemically resistant to each of the gaseous silicon compounds and hydracids noted above. The hollow fibers may be flexible or substantially rigid.

The hollow fibers may be comprised of an inorganic material, e.g., hollow glass, ceramic, sintered metal, or the like. In the case of polymers, both addition and condensation polymers which can be fabricated in any suitable manner to provide porous hollow fibers, are included. Generally organic, or organic polymers mixed with inorganic materials (e.g., fillers), are used to prepare the hollow fibers. Typical polymers can be substituted or unsubstituted polymers and may be selected from polysulfones, such as bisphenol A polysulfone (sold under the mark "Udel" by Union Carbide Corporation) or polyether sulfone (sold under the mark "Victrex" by Imperial Chemical Industries); polyacrylonitriles; polyethers; poly(arylene oxides) such as poly(phenylene oxide); polyether ketones; polysulfides; polymers from monomers having alph-olefinic unsaturation other than mentioned above such as poly(ethylene), poly(propylene), poly(butene-1), poly(4-methyl 1-pentene), polyvinyls, e.g., poly(vinyl chloride), poly(vinyl fluoride), poly(vinylidene chloride), poly(vinylidene fluoride), and the like.

Substrates prepared from polysulfone are particularly preferred.

The polysulfone or other hollow fiber substrates employed in the practice of particular embodiments of the present invention can be prepared in accordance with conventional techniques well known in the art. Hollow fibers are generally spun from a dope composition of the desired fiber polymer, quenched, washed and dried. As disclosed by Cabasso, et al. in "Composite Hollow Fiber Membranes", Journal Of Applied Polymer Science, Volume 23, 1509–1525 (1979), and in "Research and Development of NS-1 and Related Polysulfone Hollow Fibers for Reverse Osmosis Desalination of Seawater", Gulf south Research Institute, July 1985, Distributed by National Technical Information Service, U.S. Department of Commerce Publication PB 248,666, polysulfone hollow fibers can be spun from a ternary solution of polysulfone, poly(vinyl pyrrolidone) and dimethylacetamide, with the total polymeric concentration in the solution desirably being 40 to 52 weight %, and the polysulfone/poly(vinyl pyrrolidone) ratio being 1.5:2.0. The well known tube in-tube jet technique is disclosed as being suitable for the spinning procedure, with water at about 21° C. beinq the preferred outside quench medium for the fibers. The quench medium in the center of the fiber is desirably air. Quenching is typically followed by washing the fibers, for example, conveniently with hot water at about 50° to 60° C. Following such washing, the hollow fibers are dried prior to being coated with the separation film layer to form the desired composite membrane. For this purpose, the polysulfone hollow fibers are typically dried by passage through a hot air drying column for a suitable period of time.

Hollow fiber substrates are typically substantailly porous and the extent of their surface and bulk porosity is controlled by dry/wet, wet, dry or melt extrusion techniques which are well known to those skilled in the semi-permeable membrane art. The porosity of the hollow fibers may be further modified by solvent annealing or high temperature annealing techniques.

The coating layer of the composite membrane is in the form of an essentially non interrupted membrane, i.e., an essentially non-porous membrane, in contact with the porous support layer.

The materials for the coating may be natural or synthetic substances, and are often polymers. Synthetic substances include both addition and condensation polymers. Typical of the useful materials which can comprise the coating are polymers which can be substituted or unsubstituted, and which are solid or liquid under gas separation conditions, and include synthetic rubbers; natural rubbers; relatively high molecular weight and/or high boiling liquids; organic prepolymers; poly(-siloxanes) (silicone polymers); polysilazanes; acrylonitrile-containing copolymers; polyesters (including polyarylates); cellulosic polymers; polysulfones, especially modified polysulfones; poly(alkylene glycols) such as poly(ethylene glycol), poly(propylene glycol), etc.; polymers from monomers having α-olefinic unsaturation such as poly(olefins), e.g., poly(ethylene), poly(-butadiene), poly(2,3-dichlorobutadiene), poly(isoprene), poly(chloroprene), poly(styrene)s including poly(styrene) copolymers, e.g., styrene butadiene copolymer, poly(vinyl halides) (e.g., poly(vinyl bromide)), poly(vinylidene halides), fluorinated ethylene copolymer, poly(arylene oxides), e.g., poly(xylylene oxide); polycarbonates; and any interpolymers including block interpolymers containing repeating units from the above, and grafts and blends containing any of the foregoing. The polymers may or may not be polymerized after application to the porous support layer.

Particularly useful materials for coatings comprise cellulose acetate, silcon rubber, and ethyl cellulose. Most preferably, a sulfonated polysulfone is utilized as the coating material for the composite membrane. Such sulfonated polysulfones are discussed in, for example, U.S. Pat. No. 3,709,841, U.S. Pat. No. 4,054,707, U.S. Pat. No. 4,207,182, European Patent Application 0,202,849, European Patent Application 0,165,077 and European Patent Application 0,202,841 all of which are incorporated herein by reference as if set out in full. Sulfonated-polysulfones are also discussed in the Journal of Applied Polymer Science, Volume 20, pages 1885-1903 (1976) in an article entitled *Sulfonated Polysulfone* by A. Noshay, et al., the contents of which is also incorporated herein by reference.

Polyarylethersulfone with at least one sulfonic acid group present on one of the aromatic rings is one of the more common sulfonated polysulfones which is applicable in the present invention. Such a polyarylethersulfone generally has the formula as follows:

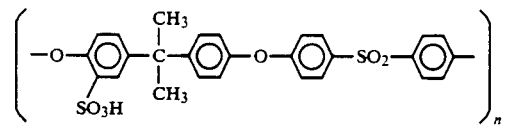

Sulfonated bisphenol A polysulfone is particularly preferred as the coating for the separation layer for the composite membrane.

As used herein, the term "sulfonic group" is meant to be an optionally salified ——$SO_2H$ group, for example the groups ——$SO^-_3$, $1/_nM^{n+}$ where M represents an $NH^+_4$ ion, an alkali metal ion, an alkaline earth metal ion, or a transition metal ion (of valency n).

The sulfonation of polysulfone can be carried out in accordance with the procedures described in, for example, U.S. Pat. No. 3,709,841. Suitable sulfonating reagents include chlorosulfonic acid ($ClSO_3H$) which is a preferred sulfonating agent. However, it is also possible to use, for example, sulfurtrioxide and its addition products with Lewis bases containing oxygen as the electron donor atom; sulfuric acid and fuming sulfuric acid can also be used. The sulfonation reaction is generally carried out at $-50°$ to $+80°$ C., preferably at $-10°$ to $+35°$ C., in solution in a solvent for the polyarylether sulfone which is inert as regards the sulfonation reaction. Halogenated hydrocarbons, especially methylene chloride, 1,2-dichloro-ethane and 1,1,2,2-tetrachloro ethane are suitable solvents.

The amount of sulfonating agent employed is generally such that the ratio of the number of sulfur atoms of the sulfonating agent to the number of sulfur atoms of the non-sulfonated polyaryl-ether-sulfone is from about 0.3 to about 6, and preferably from about 1.2 to 4. The exact number of sulfo groups which can be fixed to the non-sulfonated polyaryl-ether can of course be altered by adjusting the sulfonation conditions and, in particular, the temperature, the duration of the reaction, and the concentration of the reagents. The sulfonated polyaryl-ether-sulfone produced can be isolated in accordance with the method described in, for example, U.S. Pat. Nos. 3,709,841 or 3,875,096.

Other methods for the preparation and isolation of a sulfonated polysulfone, known in principle from the prior art, can be adopted, by analogy, to prepare such sulfonated polysulfones.

Sulfonated polyarylethersulfones with degrees of substitution between about 1.0 to about 2.5 meq/g of dry polymer that are soluble in solvents such as methoxyethanol, nitromethane, and alcohol/water mixtures are particularly useful for the preparation of the composite membranes capable of effectively separating gaseous silicon compounds from hydrogen or hydracids.

The dried polysulfone hollow fiber is coated with the coating solution of the sulfonated-polysulfone and is then dried. Such a coating and drying sequence may comprise the technique used and described in the Coplan, et al. patent, U.S. Pat. No. 4,467,001, which is incorporated herein by reference. Thus, the dried hollow fibers are passed through the coating solution contained in a coating vessel, and is then passed through a drier oven and a cure oven for contact with drying air or other suitable gas, and higher temperature curing air or other gas prior to being taken up on a winder or otherwise being processed or stored for eventual incorporation in membrane modules suitable for use in the desired separation operation. For the coating of polysulfone hollow fibers with the sulfonated polysulfone, which is a preferred embodiment of the present invention, it is generally desirable to employ drying temperatures of from about 20° C. to about 100° C. Those skilled in the art will appreciate that it is also possible to dry the separation layer on the support layer without employing the separate curing step noted above.

In a preferred embodiment of the present invention, the support layer is subjected to a high temperature annealing process. Although it is preferable to anneal the substrate prior to its being coated with the separation layer, the annealing process may be carried out on the coated substrate as well. The resulting composite membrane formed from such an annealed substrate, provides for an even greater enhancement in both separation and permeation characteristics.

Polysulfone fibers may, for example, be annealed by drying freshly spun fibers at 115° C. by passage through a hot-air drying column which fibers are then annealed by passing them through another hot air oven at a temperature of about 182° C. in the case of bisphenol A polysulfone which is close to its glass transition temperature of about 184° to 186° C. The residence time in the oven is generally about 5 seconds to 4 minutes, preferably about 10 to 30 seconds.

In use, the composite membrane will generally be assembled as part of a membrane separating device. The membrane device is designed to carry out a selective separation of at least one component from a fluid stream mixture. The membrane apparatus will typically consist of an enclosure and a membrane assembly positioned therein. The membrane assembly can be constructed in the form of a spiral wound cartridge, a hollow fiber bundle, a pleated flat sheet membrane assembly, and like assemblies common in the membrane industry. The membrane assembly is constructed so as to have a feed surface side and an opposite permeate exit side. The enclosure is constructed so as to enable the feed stream mixture to be brought into contact with the membrane feed-surface side. Conduit means are provided for the removal of the part of the feed stream that did not permeate through the membrane, and for the separate removal of the permeate components that have passed through the membrane.

In conducting the gas separations, including concentrations, of the present invention, the exit side of the membrane is maintained at a lower thermodynamic potential for the at least one permeating, fast component, i.e., $H_2$ or $HX$, than the thermodynamic potential at the feed side. The driving force for the desired permeation through the membrane is a differential in thermodynamic potential across the membrane, for instance, as provided by a differential in partial pressure. Permeating components pass into and through the membrane and can be removed from the vicinity of the exit side of the membrane to maintain the desired driving force for the permeation. The functionality of the membrane does not depend upon the direction of feed flow or the surface of the membrane which is first contacted by the gaseous feed mixture.

The gaseous mixture sent to the membrane separator can range from atmospheric to at least 2000 psig, generally about 50 to about 3000 psig, and preferably about 100 to about 200 psig.

The temperature of the gaseous mixture can vary from below ambient to about 100° C., generally about 40° to about 80° C., and preferably about 50° to about 70° C.

The concentration of the fast gas, i.e., the hydrogen or hydracid, may be present in the gaseous mixture to any extent. Thus, the concentration of the hydrogen and/or hydracid may vary from as low as 1 % by weight to as much as 99 % by weight, generally about 1 to 50 % by weight.

It is understood, of course, that in addition to the at least one hydrogen and/or hydracid gas that may be present in the gaseous mixture and the at least one gaseous silicon compound that is also present in the gaseous mixture, other fast and slow gases may be present as well. Accordingly, during the separation process utilizing the composite membrane, these extraneous fast gases may also be permeated through the permeation membrane in conjunction with the hydrogen and/or hydracid gases.

As used herein, it will be understood that the selectivity, or separation factor, of a membrane or membrane module assembly represents the ratio of the permeate rate of the more permeable (the fast gas) component to the less permeable (the slow gas) component of the gaseous mixture being separated which permeability is expressed in $ft^3$ (STP)/$ft^2$ · day · psi.

Typically, the permeation rate of hydrogen through the composite membrane at room temperature (25° C.) may be anywhere in the range of from about 0.1 to about 10.0 $ft^3$ (STP)/$ft^2$ · day · psi, and more typically is in the range of from about 0.5 to about 4.0 $ft^3$ (STP)/$ft^2$ · day · psi. Of course, this permeation rate is dependent upon the process conditions, and most importantly is dependent upon the particular semi-permeable membrane being utilized.

Similarly, the permeation rate of hydracids such as hydrogen chloride at room temperature (25° C.) is in the range of from about 0.1 to about 10.0 $ft^3$ (STP)/$ft^2$ · day · psi, and more typically in the range of from about 0.2 to about 5.0 $ft^3$ (STP)/$ft^2$ day · psi, and is again dependent upon the process conditions and the specific composite membrane being utilized.

Correspondingly, the separation factor between the fast gas components of the present invention, i.e., the hydrogen and hydracids, and the gaseous silicon compounds, is typically in the range of from about 20 to about 2,000, and more typically is in the range of from about 50 to about 500 (at 25° C.), again dependent upon specific process conditions and the particular composite membrane being utilized.

In FIG. 1, a schematic diagram is set forth showing how the present invention can be effectively utilized in the silane decomposition process for the production of polycrystalline silicon. In particular, silane is introduced to pyrolysis reactor 100 via line 10 which joins with recycle line 12 containing unreacted silane and byproduct hydrogen and is passed into the reactor via line 14.

Reactor 100 may comprise a fluidized bed reactor containing a bed of silicon seed particles or, alternatively, may comprise a bell type reactor containing a silicon starter rod. In either type of reactor, the silane is thermally decomposed to deposit metallic silicon on the silicon seed particles or silicon starter rod, respectively. As a result of such decomposition of the silane, hydrogen is produced as a by-product. Since the conversion of the silane to silicon metal is not complete, the unreacted silane, including the hydrogen by-product is typically recycled back to the reactor as shown by line 12. Silicon metal product is removed from the reactor via line 16.

In order to reduce the build up of hydrogen in the recycle loop, however, a purge stream 18 must generally be provided. In the prior art such purge stream would generally be flared and any silane contained therein would simple be lost. In the present invention, however, such loss is avoided by passing the purge stream containing both silane and hydrogen into a semipermeable membrane separator 120.

Separator 120 is provided with a cellulose acetate composite membrane having a polysulfone substrate. The permeate, which is that material passing through the membrane, has a much higher concentration of hydrogen, which is a fast gas, as compared to the raffinate, which is that material which does not pass through the membrane and contains a high concentration of the silane, the slow gas in this feed system. The permeate, containing substantially hydrogen, is passed out of the separator via line 20. The raffinate, containing substantially silane, is passed out of the separator via line 22. The recovered silane in line 22 may be recycled back to reactor 100 (not shown) or utilized in any desired manner.

Turning to FIG. 2, a schematic diagram is presented showing how the present invention can be utilized to treat an intermediary stream from a silicone compound production process in order to effectively and economically separate trichlorosilane from hydrogen.

In particular, in the preparation of silicone compounds, silicon metal is generally hydrochlorinated to an intermediary product stream comprising trichlorosilane and hydrogen from which intermediary stream the final silicone compounds are ultimately prepared. The trichlorosilane is required to be separated from this stream for further processing to produce the desired silicone products. Generally, such separation has been carried out by refrigeration. Such refrigeration technique is uneconomical inasmuch as a large amount of energy is wasted to cool the non condensable hydrogen gas. Moreover, the heat transfer from the gas phase to the condensed phase is very poor. Consequently, the prior art has had to provide large refrigeration units to accomplish the required heat transfer.

In the present invention, however, a membrane separator is utilized to accomplish a major separation of the trichlorosilane from the hydrogen to thereby produce a stream concentrated in trichlorosilane which is only then subjected to a refrigeration step. Clearly, the refrigeration unit in the process of the present invention is substantially smaller than that required by the prior art.

Accordingly, an intermediary stream containing trichlorosilane and hydrogen is first fed to a flash tank condenser 300 via line 30 to condense a portion of the trichlorosilane which leaves the condenser via line 32. The trichlorosilane/hydrogen stream, now containing a reduced amount of trichlorosilane, leaves the condenser via line 34, passes through heater 310 and is then introduced to membrane separator 320 via line 36. The stream is heated in heater 310 so as to prevent any condensation of trichlorosilane in the membrane separator. Condensation might occur if the partial pressure of the trichlorosilane in the raffinate is equal to the vapor pressure of the trichlorosilane. Membrane separator 320 contains a sulfonated polysulfone composite membrane.

The majority of the hydrogen contained in the gas mixture permeates through the membrane and leaves as the permeate through line 38. The raffinate now containing a concentrated amount of trichlorosilane with some hydrogen is then passed via line 40 into a precooler 330 in preparation for being introduced into refrigeration unit 340 via line 42. In refrigeration unit 340, the trichlorosilane is separated from the remaining hydrogen by condensation. Substantially pure trichlorosilane leaves the refrigeration unit via line 44 and substantially pure hydrogen leaves the unit via line 46. The trichlorosilane is then processed in accordance with conventional techniques to form the desired silicone compositions.

While the process described in FIG. 2 has been focused upon the production of trichlorosilane for the purpose of silicone compositions, it is understood that the same process may also be utilized for the separation of trichlorosilane along with minor amounts, if any, of dichlorosilane, silane, and/or silicon tetrachloride from hydrogen in a process which utilizes such gaseous silicon compounds for the formation of polycrystalline silicon or epitaxial silicon, such as by the Siemens type process.

The invention is hereafter further described with respect to various illustrative examples thereof. It should be understood, however, that such examples should not be construed as limiting the scope of the invention which is set forth in the appended claims.

EXAMPLES

Example I

To test the chemical stability of various membrane materials to the presence of silane, a particularly corrosive gaseous silicon compound, a number of membrane materials are exposed to silane in test cells for a period of time and then compared to untreated examples using the following techniques:

Fourier Transform Infrared
Scanning Electron Microscopy
Energy Dispersive X-Ray Spectroscopy
X Ray Photo Electron Spectroscopy The materials tested included polysulfone, polyolefin, polyvinylchloride, and cellulose acetate. These materials are exposed at 30 psig at room temperature for up to 14 days.

The results of this exposure analyzed by each of the four techniques noted above show that the chemical stability of these materials in the presence of silane is quite acceptable.

Example II

The permeability of trichlorosilane was measured using a dynamic method with the apparatus shown in FIG. 3.

The apparatus is comprised of two sections, namely, a permeation assembly shown in FIG. 3 by dotted line 100 and a feed assembly designated by solid line 200. A bomb 210 contains liquid trichlorosilane. The permeation assembly includes a membrane separator 220 comprised of a sulfonated polysulfone coating on a polysulfone substrate composite membrane, a coil 230, and a pressure transducer 240. Valve 260 controls flow of material into the membrane separator. Valve 280 controls the flow of trichlorosilane leaving bomb 210, and valve 300 controls the flow of material entering through line 12.

Both the feed and permeation assemblies were placed in oven 500. The permeation assembly was wrapped with heating tape to keep its temperature $T_2$ higher than the oven temperature $T_1$ to prevent any condensation in the membrane separator. Checking for condensation was done through the pressure transducer. Thus, if, for example, $T_2$ is kept at 55° C. and $T_1$ is set 50° C., then if the pressure transducer shows the vapor pressure of trichlorosilane at 50° C., then it is known that there is no condensation taking place in the membrane separator.

A permeate is removed from the separator through line 14 and a raffinate is removed from line 16, respectively, and its compositions are analyzed.

Example III

Figure 4:
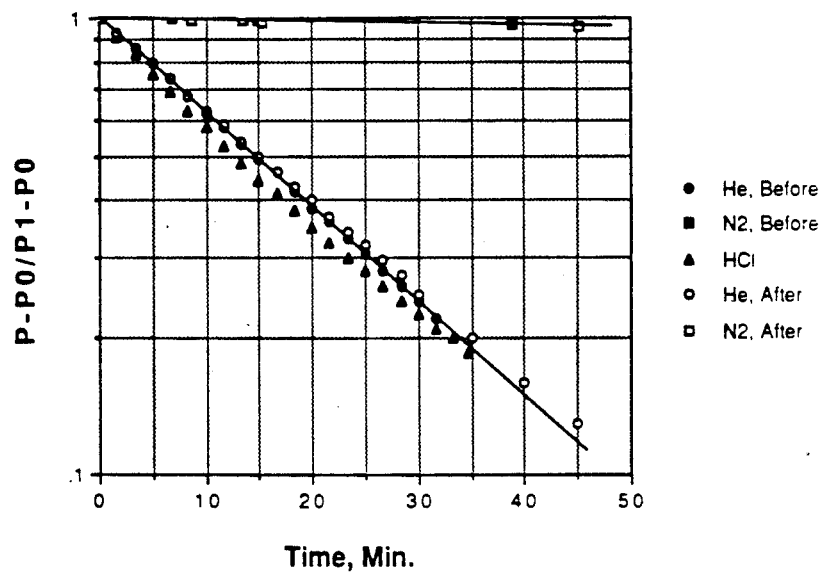
FIG. 4 is a graph showing the permeability of trichlorosilane through a sulfonated polysulfone composite semi-permeable membrane as a function of time as measured by the apparatus of FIG. 3.

Using the apparatus of Example II, measurements of trichlorosilane permeability were taken and are set forth in FIG. 4. FIG. 4 is a graph of pressure ratio as a function of time where the "Y" coordinate of $(P-P_0)/(P_1-P_0)$ represents:

$P_0$ = pressure on permeate side of membrane
$P_1$ = pressure on feed side of membrane at time equal to zero, i.e., at the start of the experiment
$P$ = pressure at any given time At the start of the experiment, the ratio of $(P-P_0)(P_1-P_0)$ is equal to 1. As the experiment continues, if the ratio becomes less than 1, this is an indication that the material being tested is permeable through the membrane. For a material that is not very permeable, the ratio of $(P-P_0)/(P_1-P_0)$ remains substantially close to 1.

For the trichlorosilane, as can be seen from FIG. 4, the results of the measurements show that it is impermeable inasmuch as the membrane pressure does not decrease with time. Instead, the membrane pressure increases slightly with time and then levels off. This slight increase in pressure is due to the permeation of nitrogen from the permeate side of the membrane. The nitrogen in the permeate side is used to purge moisture out of the membrane separator.

Example IV

Figure 5:
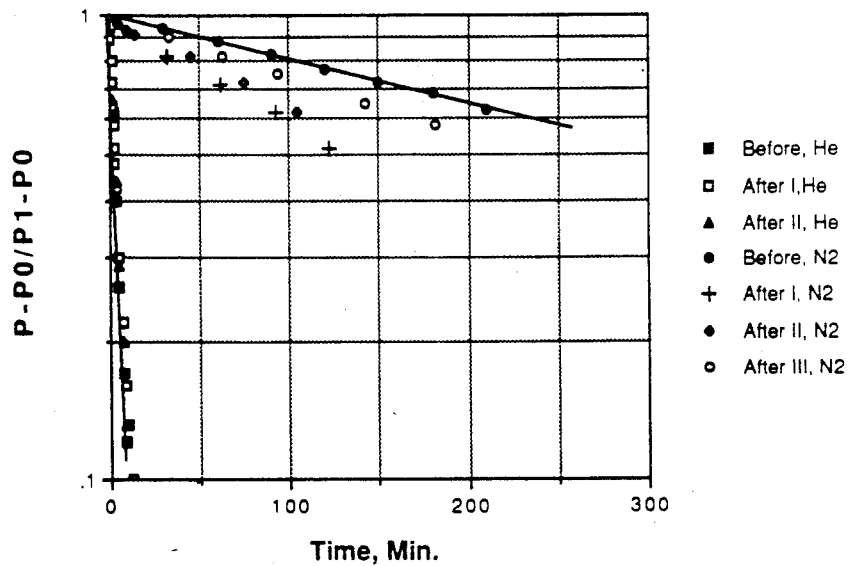
FIG. 5 is a graph showing the permeability of nitrogen and helium through a sulfonated polysulfone composite semi permeable membrane as a function of time as measured by the apparatus of FIG. 3, both before and after the membrane had been exposed to trichlorosilane.

Once again using the apparatus of Example II, and further to the measurements taken in Example III, before and after the membrane separator was exposed to trichlorosilane, permeability measurements were made for both helium and nitrogen. The results of those measurements are shown in FIG. 5 using the same set of coordinates as FIG. 4.

The "I" and "II" set forth to the right of the graph in connection with He, and the "I", "II", and "III" set forth in connection with $N_2$, respectively, refer to separate runs that were made with these materials through the membrane. The "I" run was considered a purging run.

As can be seen, after the membrane separator was contacted with the trichlorosilane, the helium permeability did not change at all while nitrogen permeability increased. However, after the membrane separator was repeatedly purged with nitrogen, the nitrogen permeability decreased with time and gradually approached the original permeability that was measured before the membrane was exposed to the trichlorosilane.

Example V

Once again using the permeating apparatus of Example II, the permeabilities of helium and nitrogen were measured, both before and after the membrane was exposed to hydrogen chloride. Hydrogen chloride permeability was also measured.

Figure 6:
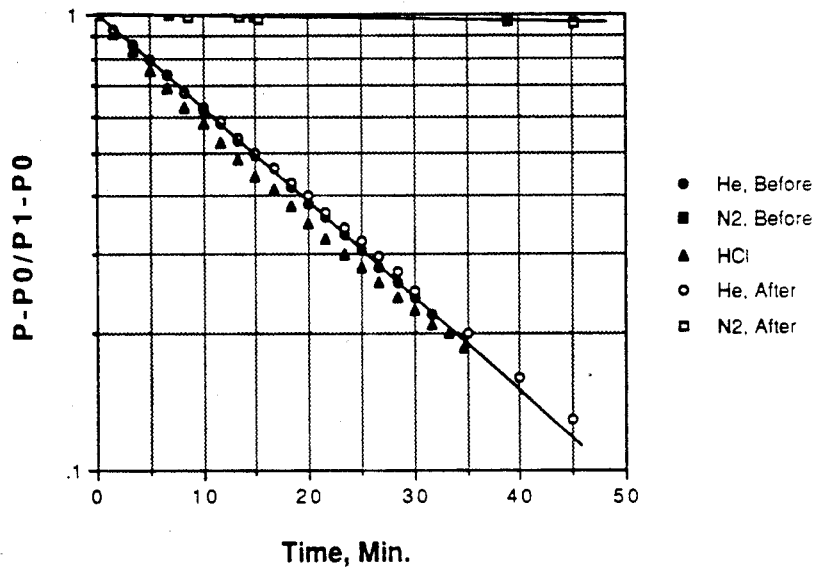
FIG. 6 is a graph showing the permeability of hydrogen chloride through a sulfonated polysulfone composite semi-permeable membrane as well as the permeabilities of both nitrogen and helium, respectively, both before and after the membrane was contacted with the hydrogen chloride.

The results of those measurements are shown in the graph set forth in FIG. 6 in which the same coordinates as that of FIG. 4 are used.

The results of these measurements reveal that hydrogen chloride permeates faster than helium and that the separation factor of hydrogen chloride with respect to helium is 1.2. Secondly, these results also show that the membrane separator is stable in the presence of hydrogen chloride inasmuch as the permeabilities of both the helium and the nitrogen remained constant, even after the membrane was exposed to the hydrogen chloride.

Example VI

Hydrogen permeablity and silane permeability through a 5 ft composite membrane comprising a cellulose acetate coating on a polysulfone substrate was also tested. The results are shown in Table I below.

TABLE I

| $H_2$ Permeability, $SiH_4$ Permeability and Separation Factor for $SiH_4$—$H_2$ Mixture | |
|---|---|
| Temp (°C.) | 32 |
| $(P/\delta)H_2$* | 0.2843 |
| $(P/\delta)SiH_4$* | $2.43 \times 10^{-3}$ |
| $\alpha(H_2/SiH_4)$ | 117 |

*Unit, $ft^3$ (STP)/$ft^2$ psi day

As can be seen, the value for the separation factor of hydrogen with respect to silane is 117. The silane permeablity remains the same even after the membrane separator was exposed to silane for over 216 hours. This indicates that chemical interaction between the silane and the components of the composite membrane was not present and the membrane remains chemically stable.

The membrane separator was tested by using two hydrogen/silane gas mixtures: one containing 48.8 mole percent silane and the other containing 1.0 mole percent silane. The operating conditions of these two tests are set forth in Table II below.

TABLE II

| Operating Conditions for $SiH_4$—$H_2$ Membrane Separation | | |
|---|---|---|
| | Test 1 | Test 2 |
| Feed Composition (molar) | 48.8% $SiH_4$ 51.2% $H_2$ | 1% $SiH_4$ 99% $H_2$ |
| Feed Pressure | 89.7 psia | 89.7 psia |
| Permeate Pressure | 25.7 psia | 25.7 psia |
| Temperature | 34~37° C. | 34~37° C. |

The results of these two tests are set forth in Tables III and IV below.

TABLE III

| Feed Flowrate l/hr | Stage Cut $\Phi$ | $Y_{H2}$ % | $X_{H2}$ % |
|---|---|---|---|
| 278.77 | 0.09 | 97.23 | 47.68 |
| 99.59 | 0.23 | 96.52 | 41.85 |
| 46.12 | 0.29 | 92.4 | 30.34 |
| 21.74 | 0.36 | 90.98 | 24.00 |

TABLE III-continued

| Feed Flowrate l/hr | Stage Cut Φ | $Y_{H2}$ % | $X_{H2}$ % |
|---|---|---|---|
| 8.34 | 0.52 | 83.57 | 16.12* |

$Y_{H2}$ = H$_2$ molar concentration in permeate
$X_{H2}$ = H$_2$ molar concentration in raffinate
Φ = Stage cut, permeate flowrate/feed flowrate
*Determined from the mass balance:

$$X_{H2} = \frac{8.34 \text{ l/hr} \times 0.512 - 4.336 \text{ l/hr} \times .8357}{4.0 \text{ l/hr}}$$

TABLE IV

| Feed Flowrate l/hr | Stage Cut Φ | $Y_{H2}$ % | $X_{H2}$ % |
|---|---|---|---|
| 516.4 | 0.19 | 100.0 | 98.59 |
| 136.9 | 0.70 | 99.92 | 96.37 |
| 114.9 | 0.82 | 99.87 | 94.75 |
| 84.3 | 0.98 | 99.75 | 75.11 |

EXAMPLE VII

Having determined the permeabilities for both hydrogen and trichlorosilane, a membrane separator can now be sized and the separation performance predicted.

The operating conditions of the membrane separator, using a sulfonated polysulfone coated polysulfone composite membrane with hollow fiber length of about 1 foot, are set forth in Table V below:

TABLE V

| Feed Temperature: | 90° C. | |
|---|---|---|
| Feed Pressure: | 45 psig | |
| Permeate Pressure: | 5 psig | |
| Feed Flow Rate: | 22.39 lb mol/hr | |
| Feed Composition: | | |
| Gas | Mol. % | Flow rate, lb mol/hr |
| H$_2$ | 71.78 | 16.0 |
| N$_2$ | 3.09 | 0.69 |
| SiHCl$_3$ | 25.13 | 5.60 |
| | 100.00 | 22.29 |

Because the trichlorosilane is not permeable through the membrane as determined earlier, it can be assumed that the separation factor of hydrogen with respect to trichlorosilane is about 2,000. Graphs showing the separation peformance and the size of separator are shown in FIG. 7 through 10 which have been briefly described earlier.

The stage cut in these figures is defined as the ratio of the permeate flow rate to the feed flow rate. The pinch point occurs at a stage cut where the partial pressure of hydrogen in the permeate side is equal to the partial pressure of hydrogen in the raffinate side. When this happens, no net hydrogen transfers from the raffinate side to the permeate side. Accordingly, the separator is desirably designed to have a stage cut below the pinch point. The value for the stage cut in this design should therefore be less than or equal to 0.58 as shown in FIG. 7.

Figure 7:
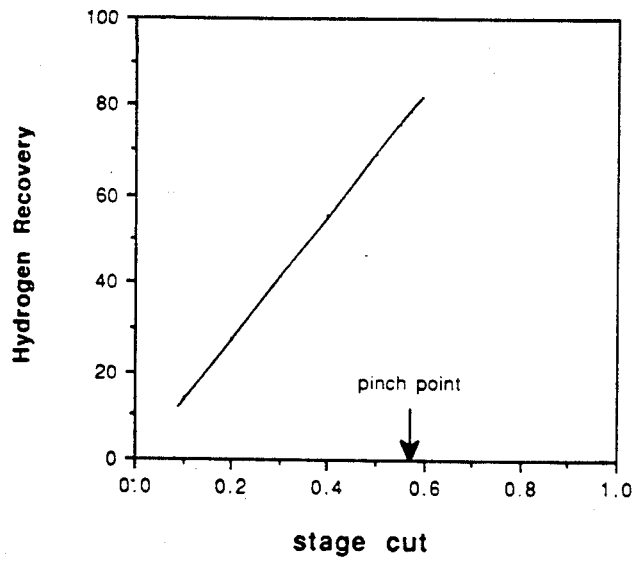
FIG. 7 is a graph showing hydrogen recovery as a function of stage cut through a sulfonated polysulfone composite semi-permeable membrane for a given set of feed conditions for a feed containing hydrogen, nitrogen and trichlorosilane.
Figure 8:
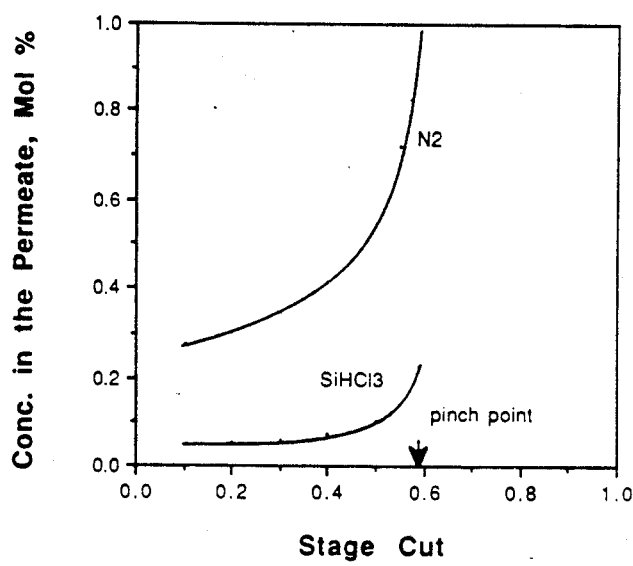
FIG. 8 is a graph showing the concentration of nitrogen and trichlorosilane as a function of stage cut through the sulfonated polysulfone composite semi permeable membrane used for the measurements set forth in FIG. 5 for the same set of feed conditions.
Figure 9:
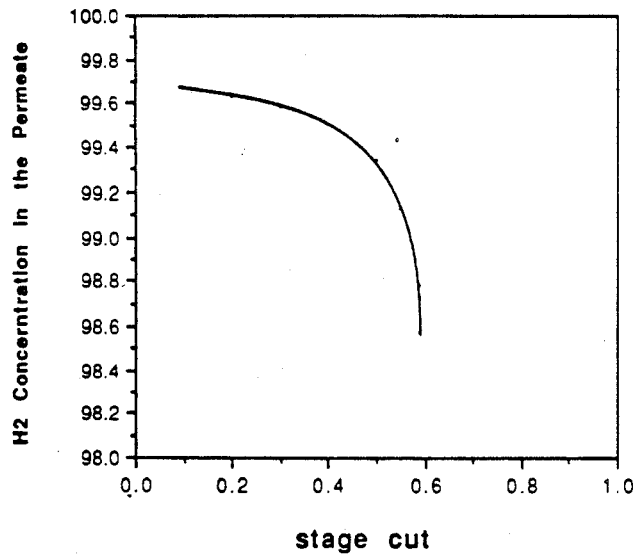
FIG. 9 is a graph showing the concentration of hydrogen as a function of stage cut through the sulfonated polysulfone composite semi-permeable membrane used for the measurements set forth in FIG. 5 for the same set of feed conditions.
Figure 10:
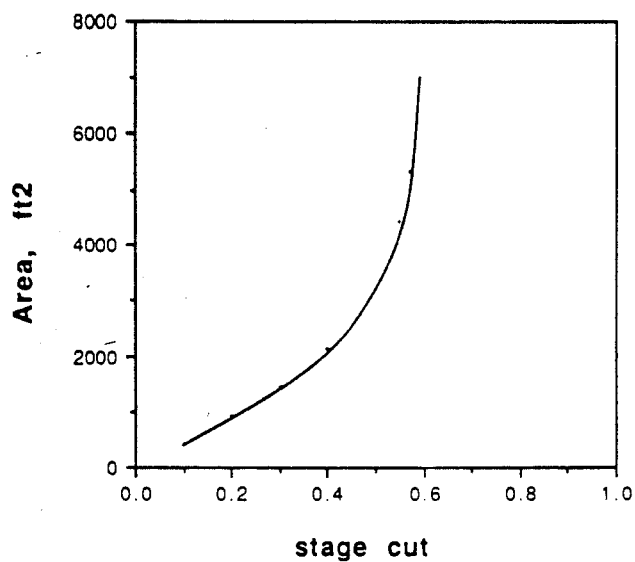
FIG. 10 is graph showing the size of the membrane surface area required for a given stage cut for the sulfonated polysulfone composite semi-permeable membrane used for the measurements set forth in FIG. 5 for the same set of feed conditions.

FIG. 7 shows that 80% of the hydrogen can be removed from the feed at a stage cut equal to 0.58, i.e., the pinch point. The concentration of triclorosilane, the concentration of nitrogen (FIG. 8), and the concentration of hydrogen in the permeate at the pinch point (FIG. 9) are 0.25%, 0.95% and 98.8%, respectively. Accordingly, from FIG. 10, it is determined that the surface area required for the membrane at the pinch point for the feed conditions noted in Table V is approximately 7,000 ft$^2$.

What is claimed is:

1. A method for separating at least a first gas selected from the group consisting of H$_2$, HX and mixtures thereof contained in a gaseous mixture from at least a second gas selected from the group consisting of SiX$_a$H$_b$ and mixtures thereof, where X = a halogen ion, a = 0 to 4, b = 0 to 4, a + b = 4 contained in said gaseous mixture which comprises contacting the gaseous mixture with one surface of a semi-permeable membrane which exhibits selective permeation of the at least first gas over that of the at least second gas, and removing from the vicinity of the opposite surface of the semi-permeable membrane a permeate having a concentration of the at least first gas which is greater than the concentration of the at least first gas in the gaseous mixture.

2. The method of claim 1, wherein the semi-permeable membrane is an asymmetric membrane or a composite membrane.

3. The method of claim 2, wherein the composite membrane comprises a porous support layer having substantially no separation characteristics with respect to the gaseous mixture and a substantially non-porous separation layer positioned on the support layer which substantially determines the selective permeation characteristics of the composite membrane.

4. The method of claim 3, wherein the support layer comprises at least one of polysulfone, polyolefins, polyphenylenesulfide and polyether keytone.

5. The method of claim 3, wherein the support layer is polysulfone.

6. The method of claim 3, wherein the separation layer comprises at least one of sulfonated-polysulfone, cellulosic polymers, cellulose acetate, synthetic and natural rubbers, polysiloxanes, polysilazanes, polyesters, polycarbonates, and mixtures thereof.

7. The method of claim 3, wherein the separation layer is a sulfonated polysulfone.

8. The method of claim 7, wherein the sulfonated polysulfone is sulfonated bisphenol A polysulfone.

9. The method of claim 3, wherein the separation layer has a thickness in the range of from about 0.01 to 10.0 microns.

10. The method of claim 3, wherein the separation layer has a thickness in the range of from about 0.05 to 2.0 microns.

11. The method of claim 3, wherein the separation layer comprises sulfonated polysulfone and the support layer comprises polysulfone.

12. The method of claim 3, wherein the separation layer is comprised of cellulose acetate and the support layer is comprised of polysulfone.

13. The method of claim 3, wherein the support layer is an annealed polymeric material.

14. The method of claim 2, wherein the asymmetric membrane comprises at least one of sulfonated-polysulfone, cellulosic polymers, cellulose acetate, synthetic and natural rubbers, polysiloxanes, polysilazanes, polyesters, polycarbonates, and mixtures thereof.

15. The method of claim 2, wherein the asymmetric membrane is a sulfonated polysulfone.

16. The method of claim 15, wherein the sulfonated polysulfone is sulfonated bisphenol A polysulfone.

17. The method of claim 1, wherein the composite membrane is in hollow fiber form.

18. The method of claim 1, wherein the said at least first gas comprises hydrogen and the said at least second gas comprises silane.

19. The method of claim 1, wherein the said at least first gas is hydrogen chloride and the said at least second gas is trichlorosilane and/or dichlorosilane.

20. The method of claim 1, wherein HX is hydrogen chloride, hydrogen fluoride, hydrogen bromide, hydrogen iodide, or mixtures thereof.

21. The method of claim 1, wherein $SiX_aH_b$ is silicon tetrachloride, trichlorosilane, dichlorosilane, monochlorosilane, silane or mixtures thereof.

22. A method of separating hydrogen from silane contained in a gaseous mixture which comprises contacting the gaseous mixture with one surface of a semi-permeable membrane which exhibits selective permeation for the hydrogen over that of the silane and removing from the vicinity of the opposite surface of the semi permeable membrane a permeate having a concentration of hydrogen which is greater than the hydrogen concentration in the gaseous feed mixture.

23. The method of claim 22, wherein the semi-permeable membrane is an asymmetric membrane or a composite membrane.

24. The method of claim 23, wherein the composite membrane comprises a porous support layer having substantially no separation characteristics with respect to the gaseous mixture and a substantially non-porous separation layer positioned on the support layer to substantially determine the selective permeation characteristics of the composite membrane.

25. The method of claim 24, wherein the separation layer is a sulfonated-polysulfone and the support layer is a polysulfone.

26. The method of claim 24, wherein the separation layer is cellulose acetate and the support layer is a polysulfone.

27. A method of separating hydrogen from trichlorosilane contained in a gaseous mixture which comprises contacting the gaseous mixture with one surface of a semi-permeable membrane which exhibits selective permeation for the hydrogen over that of the trichlorosilane and removing from the vicinity of the opposite surface of the semi-permeable membrane a permeate having a concentration of hydrogen which is greater than the hydrogen concentration in the gaseous feed mixture.

28. The method of claim 27, wherein the semi-permeable membrane is an asymmetric membrane or a composite membrane.

29. The method of claim 28, wherein the composite membrane comprises a porous support layer having substantially no separation characteristics with respect to the gaseous mixture and a substantially non-porous separation layer positioned on the support layer to substantially determine the selective permeation characteristics of the composite membrane.

30. The method of claim 29, wherein the separation layer is a sulfonated-polysulfone and the support layer is a polysulfone.

31. The method of claim 29, wherein the separation layer is cellulose acetate and the support layer is a polysulfone.

32. A process for producing a semiconductor silicon metal from a chlorosilane selected from the group consisting of trichlorosilane, dichlorosilane and mixtures thereof, which comprises:
(a) providing the chlorosilane in admixture with hydrogen gas in a reaction zone having a temperature sufficient to effect reduction and decomposition of said chlorosilane to silicon metal on a deposition surface; and then
(b) contacting exhaust gases leaving the reaction zone comprised of at least unreacted chlorosilanes, hydrogen, and by product hydrogen chloride with a semi-permeable membrane separator which exhibits selective permeation of the hydrogen and hydrogen chloride over the chlorosilanes, to produce a permeate having a concentration of hydrogen and hydrogen chloride which is greater than the concentration of hydrogen and hydrogen chloride in the exhaust gases, and a raffinate having a concentration of chlorosilanes which is greater than the concentration of such chlorosilanes in the exhaust gases.

33. The process of claim 32, wherein the raffinate stream is recycled to the reaction zone.

34. The process of claim 32, wherein the exhaust gases are cooled prior to contacting the membrane separator to a temperature such that a portion of the trichlorosilane is condensed and removed.

35. The process of claim 32, wherein the semiconductor silicon metal produced is a polycrystalline silicon metal.

36. The process of claim 32, wherein the semiconductor silicon produced is an epitaxial silicon metal.

37. The process of claim 32, wherein the semi-permeable membrane is an asymmetric membrane or a composite membrane.

38. The process of claim 37, wherein the composite membrane comprises a porous support layer having substantially no separation characteristics with respect to the gaseous mixture and a substantially non-porous separation layer positioned on the support layer which substantially determines the selective permeation characteristics of the composite membrane.

39. The process of claim 38, wherein the support layer comprises at least one of polysulfone, polyolefins, polyphenylenesulfide and polyether ketone.

40. The process of claim 38, wherein the support layer is polysulfone.

41. The process of claim 38, wherein the separation layer comprises at least one of sulfonated-polysulfone, cellulosic polymers, cellulose acetate, synthetic and natural rubbers, polysiloxanes, polysilazanes, polyesters, polycarbonates, and mixtures thereof.

42. The process of claim 38, wherein the separation layer is a sulfonated polysulfone.

43. The process of claim 42, wherein the sulfonated polysulfone is sulfonated bisphenol A polysulfone.

44. The process of claim 38, wherein the separation layer has a thickness in the range of from about 0.01 to 10.0 microns.

45. The process of claim 38, wherein the separation layer has a thickness in the range of from about 0.05 to 2.0 microns.

46. The process of claim 38, wherein the separation layer comprises sulfonated polysulfone and the support layer comprises polysulfone.

47. The process of claim 38, wherein the separation layer is comprised of cellulose acetate and the support layer is comprised of polysulfone.

48. The process of claim 38, wherein the support layer is an annealed polymeric material.

49. The process of claim 37, wherein the asymmetric membrane comprises at least one of sulfonated-polysulfone, cellulosic polymers, cellulose acetate, synthetic and natural rubbers, polysiloxanes, polysilazanes, polyesters, polycarbonates, and mixtures thereof.

50. The process of claim 37, wherein the asymmetric membrane is a sulfonated polysulfone.

51. The process of claim 50, wherein the sulfonated polysulfone is sulfonated bisphenol A polysulfone.

52. The process of claim 32, wherein the semi-permeable membrane is in hollow fiber form.

53. The process of claim 32, wherein the reaction zone is a bell-jar reactor and the deposition surface is a stationary elongated rod.

54. The process of claim 32, wherein the reaction zone is a fluidized bed reactor and the deposition surface is comprised of fluidized seed particles.

55. A process for producing a semiconductor silicon metal from silane which comprises:
  (a) providing the silane in admixture with hydrogen gas in a reaction zone having a temperature sufficient to effect reduction and decomposition of said silane to silicon metal on a deposition surface; and then
  (b) contacting exhaust gases leaving the reaction zone comprised of at least unreacted silane and hydrogen with a semi-permeable membrane separator which exhibits selective permeation of the hydrogen over the silane to produce a permeate having a concentration of hydrogen which is greater than the concentration of hydrogen in the exhaust gases and a raffinate having a concentration of silane which is greater than the concentration of such silane in the exhaust gases.

56. The process of claim 55, wherein the silane is recycled to the reaction zone.

57. The process of claim 55, wherein the semi-permeable membrane is an asymmetric membrane or a composite membrane.

58. The process of claim 57, wherein the composite membrane comprises a porous support layer having substantially no separation characteristics with respect to the gaseous mixture and a substantially non-porous separation layer positioned on the support layer which substantially determines the selective permeation characteristics of the composite membrane.

59. The process of claim 58, wherein the support layer comprises at least one of polysulfone, polyolefins, polyphenylenesulfide and polyether ketone.

60. The process of claim 58, wherein the support layer is polysulfone.

61. The process of claim 58, wherein the separation layer comprises at least one of sulfonated-polysulfone, cellulosic polymers, cellulose acetate, synthetic and natural rubbers, polysiloxanes, polysilazanes, polyesters, polycarbonates, and mixtures thereof.

62. The process of claim 58, wherein the separation layer is a sulfonated polysulfone.

63. The process of claim 62, wherein the sulfonated polysulfone is sulfonated bisphenol A polysulfone.

64. The process of claim 58, wherein the separation layer has a thickness in the range of from about 0.01 to 10.0 microns.

65. The process of claim 58, wherein the separation layer has a thickness in the range of from about 0.05 to 2.0 microns.

66. The process of claim 58, wherein the separation layer comprises sulfonated polysulfone and the support layer comprises polysulfone.

67. The process of claim 58, wherein the separation layer is comprised of cellulose acetate and the support layer is comprised of polysulfone.

68. The process of claim 58, wherein the support layer is an annealed polymeric material.

69. The process of claim 57, wherein the asymmetric membrane comprises at least one of sulfonated-polysulfone, cellulosic polymers, cellulose acetate, synthetic and natural rubbers, polysiloxanes, polysilazanes, polyesters, polycarbonates, and mixtures thereof.

70. The process of claim 57, wherein the asymmetric membrane is a sulfonated polysulfone.

71. The process of claim 70, wherein the sulfonated polysulfone is sulfonated bisphenol A polysulfone.

72. The process of claim 55, wherein the semi-permeable membrane is in hollow fiber form.

73. The process of claim 55, wherein the reaction zone is a bell-jar reactor and the deposition surface is a stationary elongated rod.

74. The process of claim 55, wherein the reaction zone is a fluidized bed reactor and the deposition surface is comprised of fluidized seed particles.

* * * * *

REEXAMINATION CERTIFICATE (2962nd)

United States Patent [19]

Hsieh et al.

[11] B1 4,941,893

[45] Certificate Issued Jul. 30, 1996

[54] GAS SEPARATION BY SEMI-PERMEABLE MEMBRANES

[75] Inventors: Shan-Tao Hsieh, Charleston; George E. Keller, II, South Charleston, both of W. Va.

[73] Assignee: Advanced Silicon Materials, Inc., Moses Lake, Wash.

Reexamination Request:
No. 90/004,015, Nov. 3, 1995

Reexamination Certificate for:
Patent No.: 4,941,893
Issued: Jul. 17, 1990
Appl. No.: 409,059
Filed: Sep. 19, 1989

[51] Int. Cl.[6] ............................ B01D 53/22; B01D 71/68
[52] U.S. Cl. ............................ 95/48; 95/55; 97/10; 97/12; 97/13; 423/342; 423/347
[58] Field of Search .................... 95/45–56; 96/7–14; 423/248, 342, 347

[56] References Cited

U.S. PATENT DOCUMENTS

| | | | |
|---|---|---|---|
| 4,214,020 | 7/1980 | Ward et al. | 55/158 X |
| 4,230,463 | 10/1980 | Henis | 55/71 X |
| 4,243,701 | 1/1981 | Riley et al. | 55/158 X |
| 4,313,013 | 1/1982 | Harris | 55/16 X |
| 4,398,926 | 8/1983 | Doshi | 55/158 X |
| 4,460,673 | 7/1984 | Sukigara et al. | 430/128 |
| 4,484,935 | 11/1984 | Zampini | 55/158 |
| 4,515,762 | 5/1985 | Griesshammer et al. | 55/71 X |
| 4,519,999 | 5/1985 | Coleman et al. | 55/71 X |
| 4,654,047 | 3/1987 | Hopkins et al. | 423/248 X |
| 4,676,967 | 6/1987 | Breneman | 423/342 X |
| 4,772,296 | 9/1988 | Potts | 55/72 X |
| 4,826,599 | 5/1989 | Bikson et al. | 55/16 X |
| 4,875,945 | 10/1989 | Penzhorn et al. | 423/248 X |

FOREIGN PATENT DOCUMENTS

| | | | |
|---|---|---|---|
| 0075431 | 3/1983 | European Pat. Off. | 55/16 |
| 0301597 | 2/1989 | European Pat. Off. | 55/16 |
| 1181202 | 2/1970 | United Kingdom | 55/71 |

OTHER PUBLICATIONS

Patent Abstracts of Japan, vol. 7, No. 19, 25 Jan. 1983, JP,A,57175719 (Fuji Denki Sougou Kenkyusho K.K.) 28 Oct. 1982, "Fuji A".

Patent Abstracts of Japan, vol. 7, No. 46, Feb. 1983, JP,A, 57200216 (Fuji Denki Sougou Kenkyusho K.K.) 8 Dec. 1982, "Fuji B".

D. L. MacLean et al., "Hollow Fibers Recover Hydrogen", Chemical Engineering Feb. 25, 1980, vol. 87, No. 4 pp. 54 and 55.

*Primary Examiner*—Robert H. Spitzer

[57] ABSTRACT

A method is disclosed for separating gaseous silicon compounds from hydrogen and/or hydracids. Specifically, the method comprises the utilization of semi-permeable membranes for such gaseous separation. Particularly preferred is a composite membrane comprised of a coating separation layer of sulfonated polysulfone and a support layer of polysulfone. Mixtures of hydrogen and silane are particularly suitable for being separated by means of composite membrane separation.

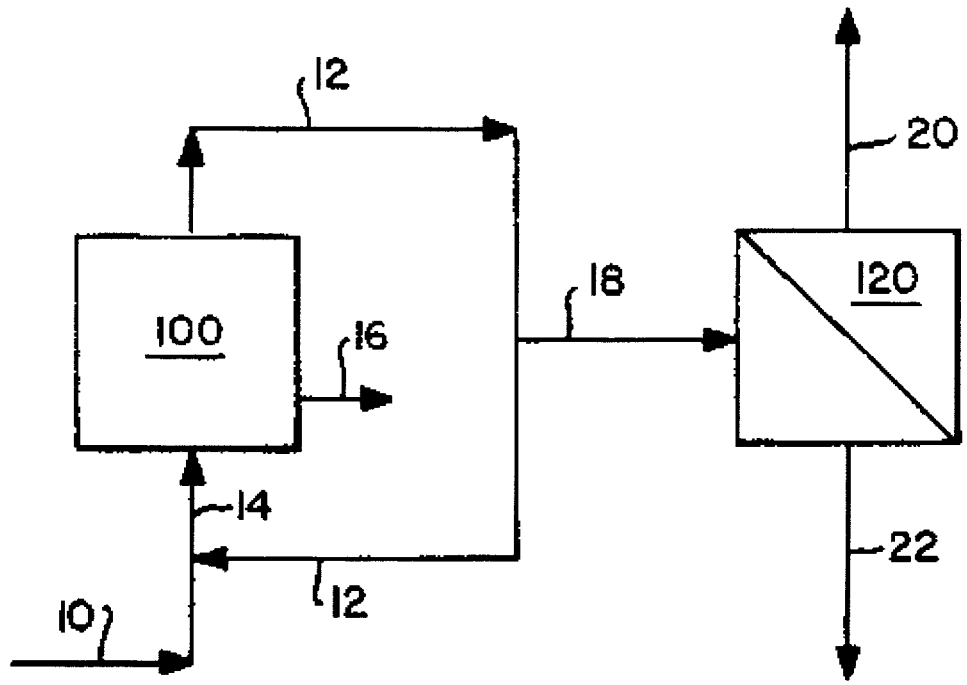

B1 4,941,893

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 17, 22, 27, 32, 38, 55 and 58 are determined to be patentable as amended.

Claims 2–16, 18–21, 23–26, 28–31, 33–37, 39–54, 56, 57 and 59–74, dependent on an amended claim, are determined to be patentable.

New claims 75–77 are added and determined to be patentable.

1. A method for separating *in a reactor* at least a first gas selected from the group consisting of $H_2$, HX and mixtures thereof contained in a gaseous mixture from at least a second gas selected from the group consisting of $SiX_aH_b$, and mixtures thereof, where X = a halogen ion, a = 0 to 4 b = 0 to 4 a + b = 4 contained in said gaseous mixture, which *method* comprises:

*passing the gaseous mixture from the reactor, via a recycle line, to a separator containing a semi-permeable membrane which exhibits selective permeation of the first gas over that of the second gas;* separating at least a portion of the first gas from the second gas by contacting the gaseous mixture with one surface of [a] *the* semi-permeable membrane which exhibits selective permeation of the at least first gas over that of the at least second gas[,];

and removing from the vicinity of the opposite surface of the semi-permeable membrane, *via a second line,* a permeate having a concentration of the at least first gas which is greater than the concentration of the at least first gas in the gaseous mixture.

17. The method of claim [1] *2*, wherein the composite membrane is in hollow fiber form.

22. A method of separating hydrogen from silane contained in a gaseous mixture *in a reaction vessel where hydrogen is produced by a reaction in the reaction vessel,* which *method* comprises:

*conveying the gaseous mixture away from the reaction vessel to a remote separator comprising a semi-permeable membrane;*

*then* contacting the gaseous mixture with one surface of [a] *the* semi-permeable membrane which exhibits selective permeation for the hydrogen over that of the silane and removing from the vicinity of the opposite surface of the [semi permeable] *semi-permeable* membrane a permeate having a concentration of hydrogen which is greater than the hydrogen concentration in the gaseous [feed] mixture.

27. A method of separating hydrogen from trichlorosilane contained in a gaseous mixture *in a reactor* which *method* comprises *passing the gaseous mixture from the reactor, via a recycle line, to a separator apart from the reactor and which contains a semi-permeable membrane that exhibits selective permeation of the hydrogen over the trichlorosilane, separating at least a portion of the hydrogen from the trichlorosilane by* contacting the gaseous mixture with one surface of [a] *the* semi-permeable membrane which exhibits selective permeation for the hydrogen over that of the trichlorosilane, and removing from the vicinity of the opposite surface of the semi-permeable membrane a permeate having a concentration of hydrogen which is greater than the hydrogen concentration in the gaseous feed mixture.

32. A process for producing a semiconductor silicon metal from a chlorosilane selected from the group consisting of trichlorosilane, dichlorosilane and mixtures thereof, which comprises:

(a) providing the chlorosilane in admixture with hydrogen gas in a reaction zone having a temperature sufficient to effect reduction and decomposition of said chlorosilane to silicon metal on a deposition surface; and then (b) *passing exhaust gases from the reaction zone, via a recycle line, away from the reaction zone and* contacting *said* exhaust gases [leaving the reaction zone] comprised of at least unreacted chlorosilanes, hydrogen, and by product hydrogen chloride with a semi-permeable membrane separator which exhibits selective permeation of the hydrogen and hydrogen chloride over the chlorosilanes, to produce a permeate having a concentration of hydrogen and hydrogen chloride which is greater than the concentration of hydrogen and hydrogen chloride in the exhaust gases, and a raffinate having a concentration of chlorosilanes which is greater than the concentration of such chlorosilanes in the exhaust gases.

38. The process of claim 37, wherein the composite membrane comprises a porous support layer having substantially no separation characteristics with respect to the [gaseous mixture] *exhaust gases* and a substantially nonporous separation layer positioned on the support layer which substantially determines the selective permeation characteristics of the composite membrane.

55. A process for producing a semiconductor silicon metal from silane which comprises:

(a) providing the silane in admixture with hydrogen gas in a reaction zone having a temperature sufficient to effect reduction and decomposition of said silane to silicon metal on a deposition surface; and then (b) [contacting] *conveying* exhaust gases [leaving] *away from* the reaction zone *in a recycle line to a separation zone, wherein the exhaust gases are* comprised of at least unreacted silane and hydrogen, *and contacting said exhaust gases in the separation zone* with a semi-permeable membrane separator which exhibits selective permeation of the hydrogen over the silane to produce a permeate having a concentration of hydrogen which is greater then the concentration of hydrogen in the exhaust gases and a raffinate having a concentration of silane which is greater than the concentration of such silane in the exhaust gases.

58. In the process of claim 57, wherein the composite membrane comprises a porous support layer having substantially no separation characteristics with respect to the [gaseous mixture] *exhaust gases* and a substantially nonporous separation layer positioned on the support layer which substantially determines the selective permeation characteristics of the composite membrane.

75. The process of claim 27, wherein the separator includes a refrigeration unit into which the gaseous mixture is introduced prior to contacting the gaseous mixture with the semi-permeable membrane separator.

76. The process of claim 75 wherein the gaseous mixture is contacted with the semi-permeable membrane after introduction of the gasous mixture into the refrigeration unit.

77. The process of claim 22 wherein the silane in the gaseous mixture is retained as a raffinate after contacting the gaseous mixture with the one surface of the semi-permeable membrane, and the raffinate is recycled from the separator to the reaction vessel.

* * * * *